(12) United States Patent
Huang et al.

(10) Patent No.: US 7,486,336 B2
(45) Date of Patent: Feb. 3, 2009

(54) ADC SYSTEM, VIDEO DECODER AND RELATED METHOD FOR DECODING COMPOSITE VIDEO SIGNAL UTILIZING CLOCK SYNCHRONIZED TO SUBCARRIER OF COMPOSITE VIDEO SIGNAL

(75) Inventors: Ke-Chiang Huang, Hsinchu (TW); Ta-Chan Kao, Taipei (TW); Sterling Smith, Hsin-Chu Hsien (TW)

(73) Assignee: MStar Semiconductor, Inc., ChuPei, Hsin-Chu Hsien (TW)

( * ) Notice: Subject to any disclaimer, the term of this patent is extended or adjusted under 35 U.S.C. 154(b) by 566 days.

(21) Appl. No.: 11/163,127

(22) Filed: Oct. 6, 2005

(65) Prior Publication Data
US 2006/0221242 A1 Oct. 5, 2006

Related U.S. Application Data

(60) Provisional application No. 60/594,366, filed on Mar. 31, 2005.

(51) Int. Cl.
*H03L 7/00* (2006.01)
(52) U.S. Cl. .................. 348/572; 348/549; 348/636
(58) Field of Classification Search .............. 348/549, 348/572, 638
See application file for complete search history.

(56) References Cited

U.S. PATENT DOCUMENTS

| | | | |
|---|---|---|---|
| 5,161,170 A | 11/1992 | Gilbert | |
| 5,231,360 A | 7/1993 | Storey | |
| 5,280,356 A | 1/1994 | Hiramatsu | |
| 5,341,218 A | 8/1994 | Kaneko | |
| 5,379,075 A | 1/1995 | Nagasawa | |
| 5,461,489 A | 10/1995 | Ohara | |
| 5,532,749 A * | 7/1996 | Hong | 348/449 |
| 5,640,670 A | 6/1997 | Samueli | |
| 5,696,559 A | 12/1997 | Kim | |
| 5,767,751 A | 6/1998 | Magnusson | |
| 5,784,118 A * | 7/1998 | Yamauchi et al. | 348/505 |
| 5,798,802 A | 8/1998 | Elmis | |
| 5,841,488 A | 11/1998 | Rumreich | |
| 5,990,968 A * | 11/1999 | Naka et al. | 348/537 |
| 6,141,057 A * | 10/2000 | Cooper et al. | 348/515 |

(Continued)

FOREIGN PATENT DOCUMENTS

GB 2 332 313 A 6/1999

(Continued)

*Primary Examiner*—Brian P Yenke
(74) *Attorney, Agent, or Firm*—Winston Hsu

(57) ABSTRACT

An analog-to-digital converting system for converting a composite video signal into a digital signal according to a synchronized clock. The analog-to-digital converting system includes an analog-to-digital converter (ADC), a color burst phase estimator and a phase-locked loop (PLL). The ADC converts the composite video signal to the digital signal according to the synchronized clock, wherein the synchronized clock is synchronized to a frequency of a color burst of a chrominance signal of the composite video signal. The color burst phase estimator, coupled to the ADC, estimates the phase of the color burst carried on the composite video signal. The PLL, coupled to the color burst phase estimator, generates the synchronized clock according to the phase of the color burst estimated by the color burst phase estimator.

28 Claims, 5 Drawing Sheets

U.S. PATENT DOCUMENTS

| | | | |
|---|---|---|---|
| 6,211,918 B1 * | 4/2001 | Uwabata et al. | 348/458 |
| 6,340,993 B1 * | 1/2002 | Hasegawa et al. | 348/572 |
| 6,522,365 B1 * | 2/2003 | Levantovsky et al. | 348/537 |
| 6,522,369 B2 * | 2/2003 | Ohta et al. | 349/39 |
| 6,580,382 B2 | 6/2003 | Yung | |
| 6,587,144 B1 | 7/2003 | Kim | |
| 6,621,523 B2 * | 9/2003 | Obitsu | 348/552 |
| 6,650,364 B1 | 11/2003 | Itani | |
| 6,707,503 B1 * | 3/2004 | Naka et al. | 348/537 |
| 6,724,430 B2 * | 4/2004 | Miyoshi et al. | 348/441 |
| 6,768,498 B1 * | 7/2004 | Kim | 345/698 |
| 7,061,541 B2 * | 6/2006 | Kim | 348/505 |
| 7,095,452 B2 | 8/2006 | Tachibana | |
| 7,098,824 B2 | 8/2006 | Yang | |
| 7,106,231 B2 | 9/2006 | Smith | |
| 7,106,387 B2 | 9/2006 | Takimoto | |
| 7,126,645 B2 | 10/2006 | Keen | |
| 7,253,755 B1 | 8/2007 | Fette | |
| 7,268,714 B2 | 9/2007 | Sherry | |
| 7,355,653 B2 * | 4/2008 | Nagamine et al. | 348/549 |
| 2003/0207675 A1 | 11/2003 | Hughes | |
| 2005/0001750 A1 | 1/2005 | Lo | |
| 2005/0270212 A1 | 12/2005 | Smith | |

FOREIGN PATENT DOCUMENTS

| | | |
|---|---|---|
| JP | 2-301209 | 12/1990 |
| JP | P2004-289801 A | 10/2004 |
| WO | 2004/082136 A1 | 9/2004 |

* cited by examiner

ADC SYSTEM, VIDEO DECODER AND RELATED METHOD FOR DECODING COMPOSITE VIDEO SIGNAL UTILIZING CLOCK SYNCHRONIZED TO SUBCARRIER OF COMPOSITE VIDEO SIGNAL

CROSS REFERENCE TO RELATED APPLICATIONS

This application claims the benefit of U.S. Provisional Application No. 60/594,366, which was filed on 31 Mar. 2005 and is included herein by reference.

BACKGROUND OF THE INVENTION

1. Field of the Invention

The invention relates to video decoding, and more particularly, to apparatuses and related method for decoding a composite video signal according to a clock synchronized to a color burst of the composite video signal.

2. Description of the Prior Art

Since the appearance of the Advanced Television Systems Committee (ATSC) standard, great efforts have been made to perfect a digital TV system. For compatibility, a digital TV system designed for decoding a digital TV signal complying with an ATSC specification must also be able to decode a composite video signal complying with specifications of conventional analog TV systems, such as the National Television System Committee (NTSC) standard or the Phase Alternate Line (PAL) standard. In this way, a user is able to watch programs transmitted by either a digital TV signal or an analog TV signal using the same equipment.

Conventionally, a clock utilized for digitalizing the incoming composite video signal is usually extracted from another clock source not specifically designed to sample the composite video signal. Conventional video decoder may digitize the incoming composite video signal with reference to target line samples, such as 858 samples/line for NTSC standard. Since a chrominance signal is carried on a sub-carrier of the composite video signal, complicated circuits are needed in order to demodulate the chrominance signal.

SUMMARY OF THE INVENTION

It is therefore one of the objectives of the claimed invention to provide an apparatus and related method for decoding a composite video signal according to a clock synchronized to a color burst of the composite video signal, to solve the above-mentioned problems.

The claimed invention provides an analog-to-digital converting system for converting a composite video signal into a digital signal according to a synchronized clock. The analog-to-digital converting system comprises an analog-to-digital converter (ADC), a color burst phase estimator and a phase-locked loop (PLL). The ADC, coupled to the composite video signal, generates the digital signal according to the synchronized clock, where the synchronized clock is synchronized to a frequency and a phase of a color burst of chrominance signals of the composite video signal. The color burst phase estimator, coupled to the ADC, estimates the phase of the color burst carried on the composite video signal. The PLL, coupled to the color burst phase estimator, generates the synchronized clock according to the phase of the color burst estimated by the color burst phase estimator.

The claimed invention provides a method for converting a composite video signal into a digital signal according to a synchronized clock. The method comprises: converting the composite video signal into the digital signal according to the synchronized clock, the synchronized clock being synchronized to a frequency and a phase of a color burst of chrominance signals of the composite video signal; estimating the phase of the color burst carried on the composite video signal; and generating the synchronized clock according to the phase of the color burst.

The claimed invention further provides a video decoder for decoding a composite video signal to output a luminance signal and chrominance signals. The video decoder comprises an analog-to-digital converter (ADC), a color burst phase estimator, a phase-locked loop (PLL), a luminance/chrominance separator, a U/V demodulator, an interpolation phase generator and a digital interpolator. The ADC receives the composite video signal and generates the digital signal according to the synchronized clock, where the synchronized clock is synchronized to a frequency and a phase of a color burst of chrominance signals of the composite video signal. The color burst phase estimator, coupled to the ADC, estimates the phase of the color burst carried on the composite video signal. The PLL, coupled to the color burst phase estimator, generates the synchronized clock according to the phase of the color burst estimated by the color burst phase estimator. The luminance/chrominance separator, coupled to the ADC, generates a pre-luminance signal and a pre-chrominance signal according to the digital signal. The U/V demodulator, coupled to the luminance/chrominance separator, demodulates the pre-chrominance signal to generate a first pre-chrominance signal and a second pre-chrominance signal. The interpolation phase generator, coupled to the ADC, generates an interpolation phase utilized to scale the pre-luminance signal and the pre-chrominance signal according to the horizontal synchronization tips of the composite video signal. The digital interpolator, coupled to the luminance/chrominance separator, the U/V demodulator and the interpolation phase generator, scales the pre-luminance signal, the first pre-chrominance signal and the second pre-chrominance signal to generate the luminance signal, the first chrominance signal and the second chrominance signal according to the interpolation phase.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
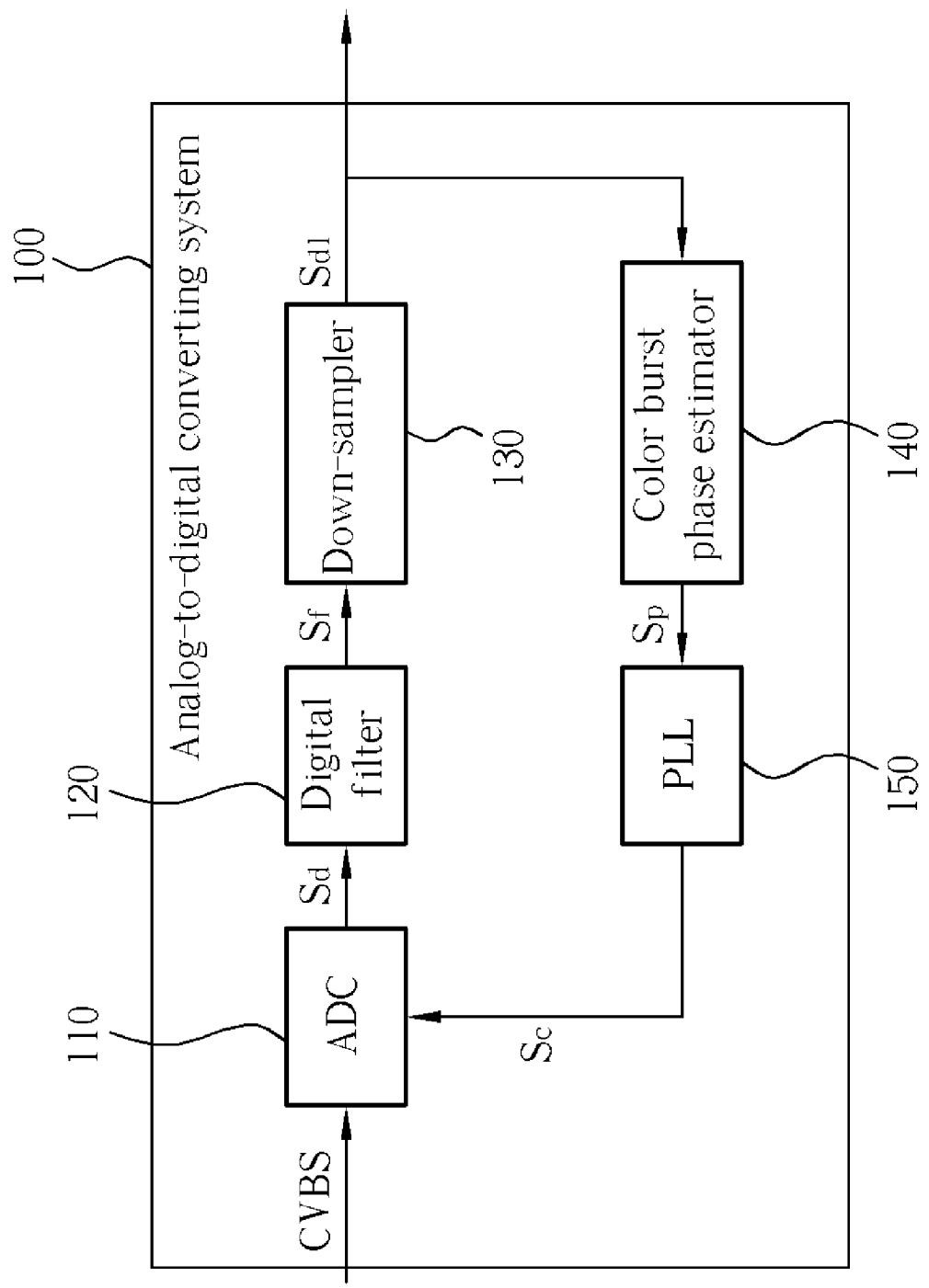
FIG. 1 is a block diagram illustrating an analog-to-digital converting system according to an embodiment of the present invention.

FIG. 1 shows a block diagram illustrating an analog-to-digital converting system 100 according to an embodiment of the present invention. The analog-to-digital converting system 100 comprises an analog-to-digital converter (ADC) 110, a digital filter 120, a down-sampler 130, a color burst phase estimator 140 and a phase-locked loop (PLL) 150. A composite video signal CVBS, an analog TV signal, is received by the analog-to-digital converting system 100. The composite video signal CVBS complies with an analog TV system specification, such as a National Television System Committee (NTSC) specification or a Phase Alternate Line (PAL) specification. Therefore, luminance information and chrominance information is transmitted by the composite video signal CVBS with the chrominance information being carried on a sub-carrier of the composite video signal CVBS. When the composite video signal CVBS is inputted into the analog-to-digital converting system 100, the ADC 110 first digitizes the composite video signal CVBS to generate a digital signal $S_d$ according to a synchronized clock $S_c$. In this embodiment, the synchronized clock $S_c$ is synchronized to the frequency and phase of the sub-carrier used for carrying the chrominance information where a frequency of the synchronized clock $S_c$ is preferably a positive integral multiple of four times, such as eight times or sixteen times, higher than the frequency of the sub-carrier. Thus, a data rate of the digital signal $S_d$ is also a multiple of four times higher than the frequency of the sub-carrier and the digital signal $S_d$ is fed into the digital filter 120. The digital filter 120 filters out a high frequency noise component of the digital signal $S_d$ and then generates a filtered signal $S_f$. The higher the data rate of the digital signal $S_d$ is, the better the performance is. In this way, the high frequency noise component can be filtered out more thoroughly.

The down-sampler 130 down-samples the filtered signal $S_f$ to generate a first digital signal $S_{d1}$ with a data rate four times as great as the frequency of the sub-carrier. Please note that the chrominance information of the composite video signal CVBS is carried via phases of the sub-carrier, and a data rate of the desired chrominance information should be four times as great as the frequency of the sub-carrier. Therefore, the down-sampler 130 down-samples the filtered signal $S_f$ so that the data rate of the first digital signal $S_{d1}$ is four times as great as the frequency of the sub-carrier. The first digital signal $S_{d1}$ is then used to decode the chrominance information and the luminance information transmitted via the composite video signal CVBS. Additionally, the first digital signal $S_{d1}$ is fed into the color burst phase estimator 140 to estimate a phase signal $S_p$ of a color burst of the composite video signal CVBS. According to the phase signal $S_p$, the PLL 150 generates the wanted synchronized clock $S_c$ used by the ADC 110 to perform an analog-to-digital converting operation on the composite video signal CVBS. The color burst phase estimator 140 can be understood by persons skilled in the art and further description is omitted for brevity. Please note that the digital filter 120 and the down-sampler 130 can be omitted and the functionality of the analog-to-digital converting system 100 will remain the same, as long as the synchronized clock $S_c$ is properly controlled to be four times as great as the frequency of the sub-carrier of the composite video signal CVBS.

Figure 2:
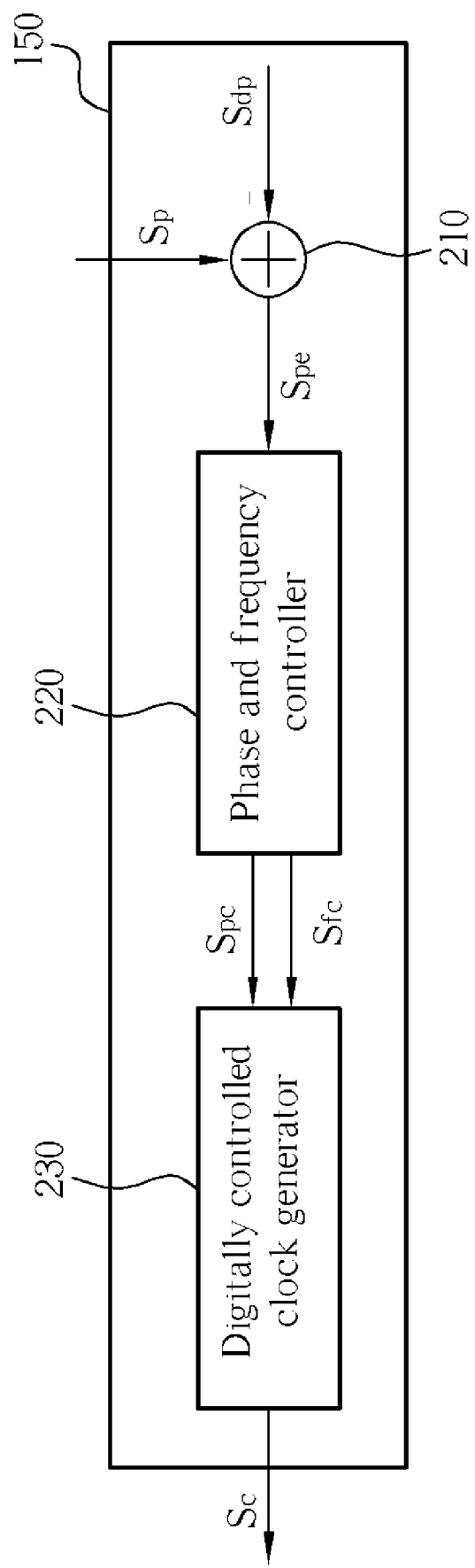
FIG. 2 is a block diagram illustrating a PLL circuit shown in FIG. 1.

FIG. 2 is a block diagram illustrating the PLL 150 shown in FIG. 1. The PLL 150 comprises an adder 210, a phase and frequency controller 220, and a digitally controlled clock generator 230. The adder 210 receives the phase signal $S_p$ and subtracts a predetermined desired phase signal $S_{dp}$ from the phase signal $S_p$ to generate a phase error signal $S_{pe}$. The predetermined desired phase signal $S_{dp}$ varies according to different TV standard. For example, the desired phase signal $S_{dp}$ is 180° for NTSC standard, while the desired phase signal $S_{dp}$ is 225° or 135° for PAL standard, depending on PAL switch. The phase error signal $S_{pe}$ is then fed into the phase and frequency controller 220 to generate a phase control signal $S_{pc}$ and a frequency control signal $S_{fc}$. The phase control signal $S_{pc}$ and frequency control signal $S_{fc}$ are fed into the digitally controlled clock generator 230 to generate the synchronized clock $S_c$ utilized in the ADC 110 to digitize the composite video signal CVBS. Therefore, the digitally controlled clock generator 230 adjusts a phase and a frequency of the synchronized clock $S_c$ through the phase control signal $S_{pc}$ and the frequency control signal $S_{fc}$. Since the operation and the implementation of the digitally controlled clock generator 230 can be understood by those skilled in this art, further description is omitted for brevity.

Figure 3:
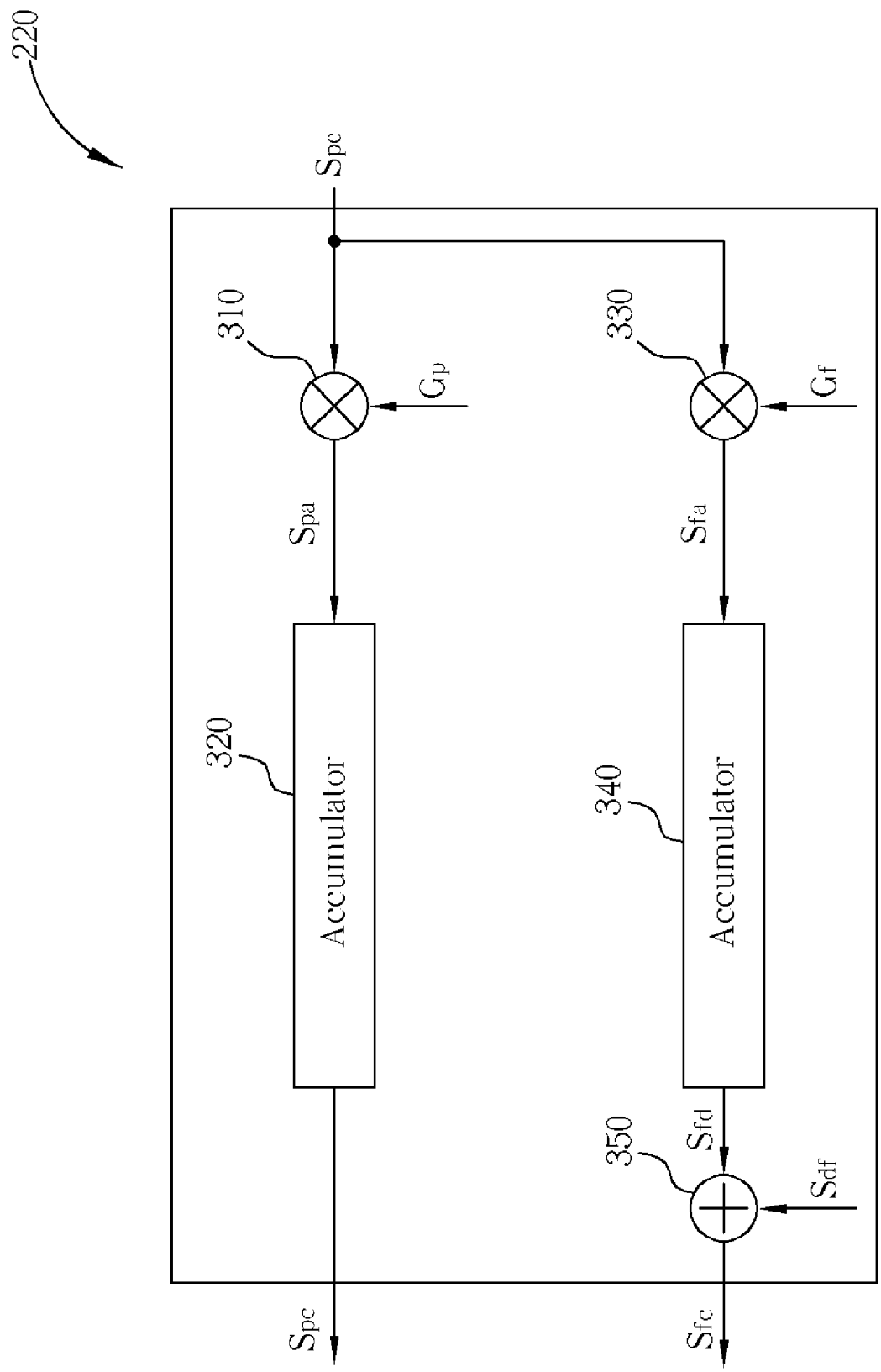
FIG. 3 is a block diagram illustrating a phase and frequency controller shown in FIG. 2.

FIG. 3 is a block diagram illustrating the phase and frequency controller 220 shown in FIG. 2. As shown in FIG. 3, the phase and frequency controller 220 includes a plurality of multipliers 310, 330, a plurality of accumulators 320, 340, and an adder 350. The phase error signal $S_{pe}$, is inputted into the multipliers 310, 330, after being fed into the phase and frequency controller 220. The multiplier 310 multiplies the phase error signal $S_{pe}$ by a predetermined phase gain factor $G_p$ to scale the phase error signal $S_{pe}$ properly and then generates a phase adjusting signal $S_{pa}$. The accumulator 320 accumulates values transmitted by the phase adjusting signal $S_{pa}$ and generates the phase control signal $S_{pc}$ outputted to the digitally controlled clock generator 230. In the other signal processing path, the multiplier 330 multiplies the phase error signal $S_{pe}$ by a predetermined frequency gain factor $G_f$ to scale the phase error signal $S_{pe}$ properly and then generates a frequency adjusting signal $S_{fa}$. The accumulator 340 accumulates values transmitted by the frequency adjusting signal $S_{fa}$ and generates a frequency difference signal $S_{fd}$. An ideal desired frequency signal $S_{df}$, representing the ideal desired multiple frequency of four times, higher than the frequency of the color burst, is added to the frequency difference signal $S_{fd}$ to generate the frequency control signal $S_{fc}$ outputted to the digitally controlled clock generator 230. It should be noted that the frequency of the ideal desired frequency signal $S_{df}$ slightly differs due to different hardware oscillating frequencies. As mentioned above, while the phase control signal $S_{pc}$ and the frequency control signal $S_{fc}$ converge, the phase and the frequency of the synchronized clock $S_c$ is precisely tuned by the digitally controlled clock generator 230.

Figure 4:
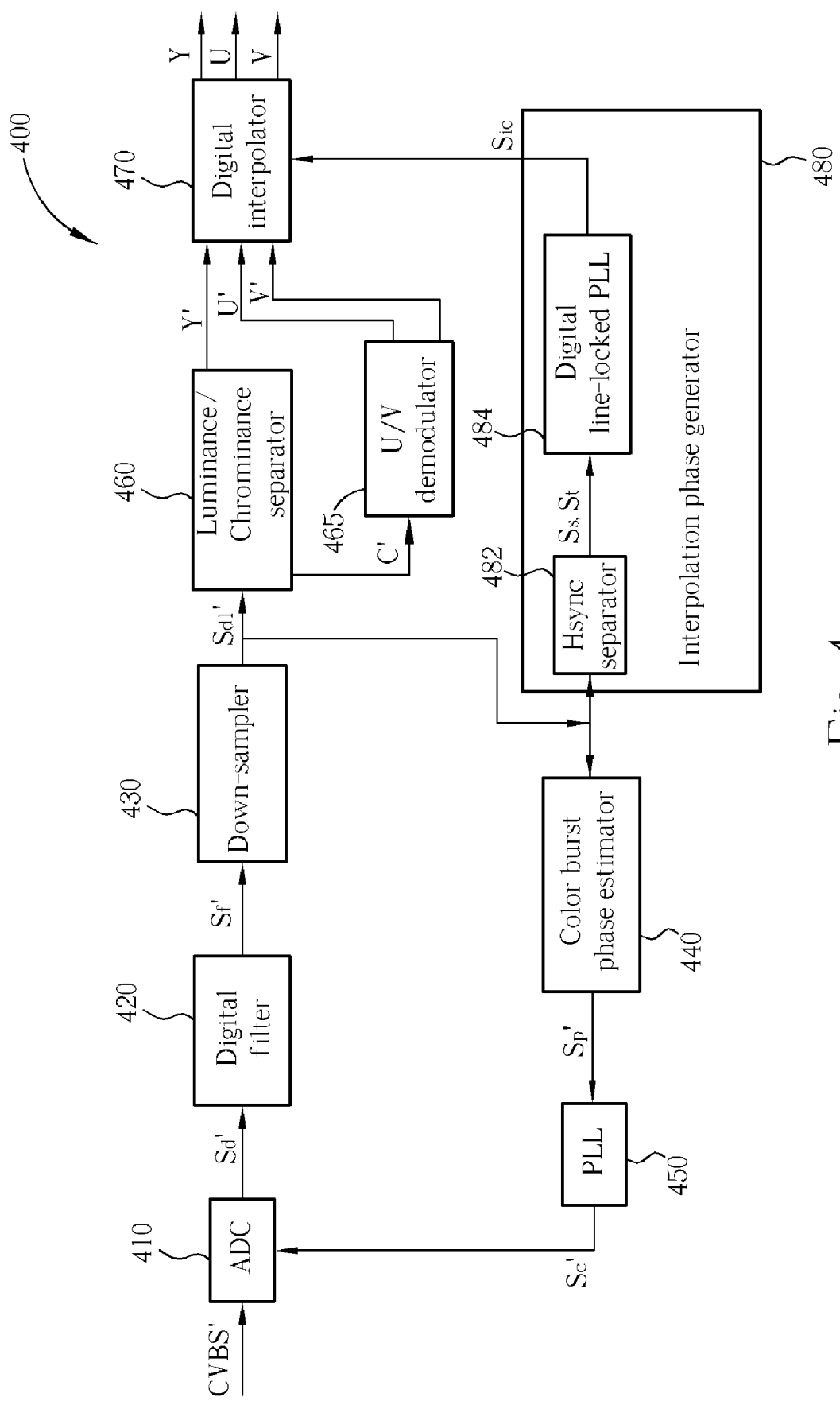
FIG. 4 is a block diagram illustrating a video decoder utilizing the above-mentioned analog-to-digital converting system according to an embodiment of the present invention.

FIG. 4 is a block diagram illustrating a video decoder 400 utilizing the above-mentioned analog-to-digital converting system according to an embodiment of the present invention. The video decoder 400 comprises an analog-to-digital converter (ADC) 410, a digital filter 420, a down-sampler 430, a color burst phase estimator 440, a phase-locked loop (PLL) 450, a luminance/chrominance separator 460, a U/V demodulator 465, a digital interpolator 470 and an interpolation phase generator 480. The video decoder 400 receives a composite video signal CVBS and decodes the composite video signal CVBS to generate a luminance signal Y, a first chrominance signal U and a second chrominance signal V. When the composite video signal CVBS is inputted into the video decoder 400, the ADC 410 digitizes the composite video signal CVBS to generate a digital signal $S_d'$ according to a synchronized clock $S_c'$. In this embodiment, the synchronized clock $S_c'$ is preferably synchronized to the frequency and phase of a sub-carrier carrying the chrominance information where a frequency of the synchronized clock $S_c'$ is a multiple of four times higher than the frequency of the sub-carrier. The digital filter 420 filters out a high frequency noise component of the digital signal $S_d'$ and generates a filtered signal $S_f'$. The down-sampler 430 down-samples the filtered signal $S_f'$ to generate a first digital signal $S_{d1}'$ with a data rate four times as great as the frequency of the sub-carrier. The first digital signal $S_{d1}'$ is then decoded to generate the chrominance signal C and the luminance signal Y. Additionally, the first digital signal $S_{d1}'$ is fed into the color burst phase estimator 440 to estimate a phase signal $S_p'$ of a color burst carried on the composite video signal CVBS. According to the phase signal $S_p'$, the PLL 450 generates the synchronized clock $S_c'$ used by the ADC 410 to perform an analog-to-digital converting operation on the composite video signal CVBS. It should be noted that if the frequency of the synchronized clock $S_c'$ is exact four times higher than the frequency of the color burst, the down-sampler 430 can be further reduced in the novel hardware structure of the video decoder 400. But the final display quality is deteriorated than a synchronized clock $S_c'$ with higher multiple frequency.

The luminance/chrominance separator 460 receives the first digital signal $S_{d1}'$ and generates a pre-luminance signal Y' and a pre-chrominance signal C'. The pre-chrominance signal C' is further fed into the U/V demodulator 465. The U/V demodulator 465 demodulates the pre-chrominance signal C' and generates a first pre-chrominance signal U' as well as a second pre-chrominance signal V'. A data rate of the first digital signal $S_{d1}'$ is meant to facilitate the demodulation of the pre-chrominance signal C', but the data rate of the first digital signal $S_{d1}'$ does not match that required to display a video program transmitted by the composite video signal CVBS for each scan line on a TV screen. As a result, the digital interpolator 470 is required for scaling the pre-luminance signal Y', the first pre-chrominance U' and the second pre-chrominance signal V' to generate the desired luminance signal Y, the first chrominance signal U and the second chrominance signal V according to an interpolation phase $S_{ic}$. In this way, data rates of the luminance signal Y, the first chrominance signal U and the second chrominance signal V match that required for displaying pixels at each scan line. The operation and the implementation of the luminance/chrominance separator 460, the U/V demodulator 465 and the digital interpolator 470 can be understood by persons skilled in the art and further description is thus omitted for brevity.

As shown in FIG. 4, the interpolation phase generator 480 contains an HSYNC separator 482 and a digital line-locked PLL 484. The HSYNC separator 482 receives the first digital signal $S_{d1}'$ and separates the horizontal synchronization tips to determine the starting and terminating boundary of each scan line for displaying a video program transmitted by the composite video signal CVBS, according to two successive horizontal synchronization tips. A horizontal synchronization tip is defined in a specification of an analog TV system for recognizing a starting point of a scan line. According to the starting boundary signal $S_s$ and the terminating boundary signal $S_t$, the digital line-locked PLL 484 generates the interpolation phase $S_{ic}$ utilized by the digital interpolator 470 to scale the pre-luminance signal Y', the first pre-chrominance U' and the second pre-chrominance signal V'.

The chrominance signal C(n) can be represented in view of U/V:

$$C(n)=U(n)*\sin(\theta(n))+V(n)*\cos(\theta(n))$$

wherein, preferably in this embodiment, θ(n) can be 0°, 90°, 180°, 270°. The U/V demodulator 465 and luminance/chrominance separator 460 can be simplified according to the present invention.

Figure 5:
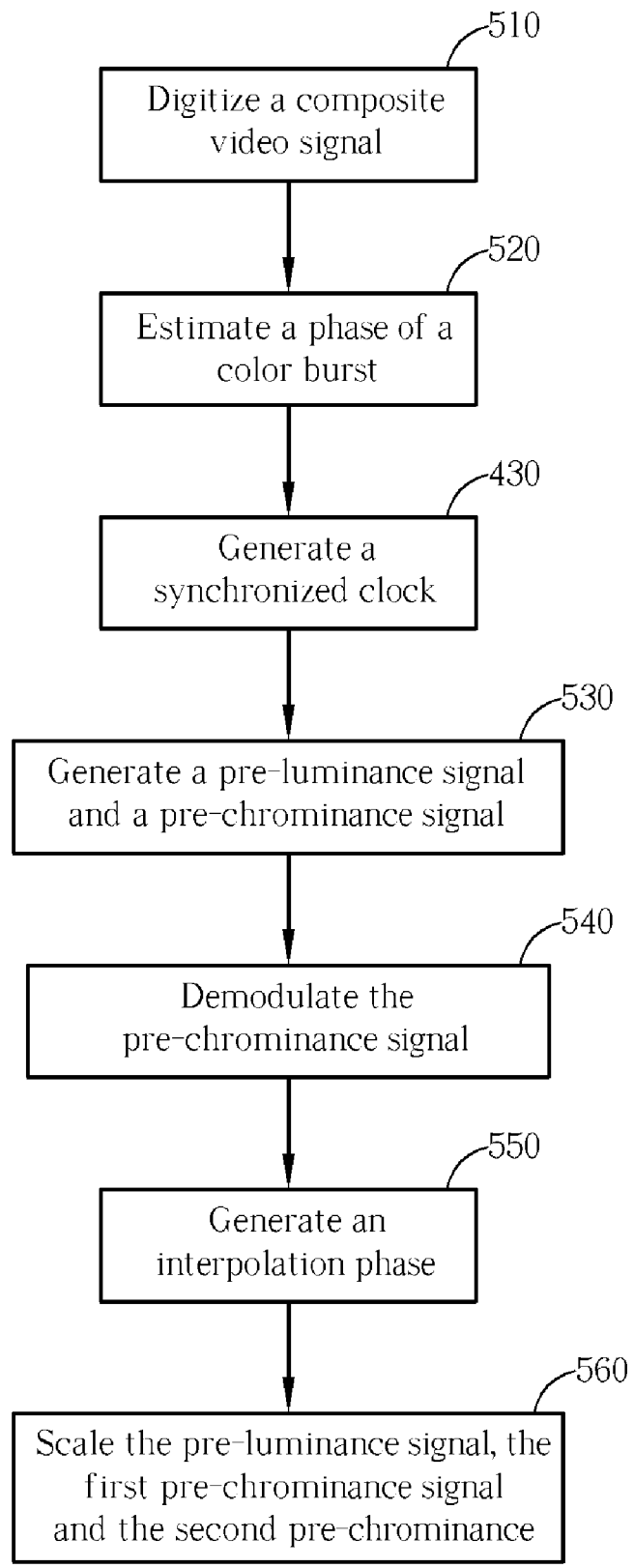
FIG. 5 is a flow chart illustrating a video decoding method according to one embodiment of the present invention.

FIG. 5 is a flow chart illustrating the video decoding method according to one embodiment of the present invention. The method is detailed as follows:

Step 510: Converte a composite video signal into the digital signal according to the synchronized clock, the synchronized clock being synchronized to a frequency and a phase of a color burst of chrominance signals of the composite video signal.

Step 520: Estimate a phase of a color burst carried on the composite video signal.

Step 530: Generate the synchronized clock according to the phase of the color burst.

Step 540: Generate a pre-luminance signal and a pre-chrominance signal according to the digital signal.

Step 550: Demodulate the pre-chrominance signal to generate a first pre-chrominance signal and a second pre-chrominance signal.

Step 560: Generate an interpolation phase utilized to scale the pre-luminance signal, the first pre-chrominance signal and the second pre-chrominance signal according to the horizontal synchronization tips of the composite video signal.

Step 570: Scale the pre-luminance signal, the first pre-chrominance signal and the second pre-chrominance signal to generate the luminance signal, the first chrominance signal and the second chrominance signal according to the interpolation phase.

The present invention provides an apparatus and a related method for decoding a composite video signal according to a synchronized clock synchronized to a sub-carrier of the composite video signal. In this way, the effort required to demodulate a chrominance signal transmitted by the composite video signal is largely reduced through the inclusion of an additional reference clock source.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An analog-to-digital converting system for converting a composite video signal into a digital signal according to a synchronized clock, comprising:
    an analog-to-digital converter (ADC), for receiving the composite video signal and generating the digital signal according to the synchronized clock, the synchronized clock being synchronized to a frequency and a phase of a color burst of chrominance signals of the composite video signal;
    a color burst phase estimator, coupled to the ADC, for estimating the phase of the color burst carried on the composite video signal; and
    a phase-locked loop (PLL), coupled to the color burst phase estimator, for generating the synchronized clock according to the phase of the color burst estimated by the color burst phase estimator;
    wherein the PLL comprises:
        an adder, coupled to the color burst phase estimator, for computing a difference between a pre-determined desired phase value and the phase of the color burst estimated by the color burst phase estimator to generate a phase error signal;
        a phase and frequency controller, coupled to the adder, for generating a phase control signal and a frequency control signal according to the phase error signal; and
        a digitally controlled clock generator, coupled to the phase and frequency controller, for outputting the synchronized clock according to the phase control signal and the frequency control signal.

2. The analog-to-digital converting system of claim 1, wherein a data rate of the digital signal is a positive integral multiple of four times the frequency of the color burst.

3. The analog-to-digital converting system of claim 2, wherein a frequency of the synchronized clock is a multiple of four times higher than the frequency of the color burst, the system further comprising:

a down-sampler, coupled between the ADC and the color burst phase estimator, for down-sampling the digital signal to generate a down-sampled digital signal with a data rate four times as great as the frequency of the color burst, where the color burst phase estimator estimates the phase of the color burst according to the down-sampled digital signal.

4. The analog-to-digital converting system of claim 3, further comprising:
a digital filter, coupled between the ADC and the down-sampler, for filtering out a high frequency noise component of the digital signal to generate a filtered signal;
wherein the filtered signal is fed into the down-sampler for generating the down-sampled digital signal.

5. The analog-to-digital converting system of claim 1, wherein the phase and frequency controller comprises:
a multiplier, coupled to the phase error signal, for multiplying the phase error signal by a pre-determined gain and for outputting a phase adjusting signal; and
an accumulator, coupled to the multiplier, for accumulating the phase adjusting signal to generate the phase control signal.

6. The analog-to-digital converting system of claim 1, wherein the phase and frequency controller comprises:
a multiplier, coupled to the phase error signal, for multiplying the phase error signal by a pre-determined gain and for outputting a frequency adjusting signal;
an accumulator, coupled to the multiplier, for accumulating the frequency adjusting signal to generate a frequency difference signal; and
an adder, coupled to the accumulator, for adding an ideal desired frequency value to the frequency difference signal and for generating the frequency control signal.

7. The analog-to-digital converting system of claim 1, wherein the composite video signal complies with NTSC (National Television System Committee) standards or PAL (Phase Alternate Line) standards.

8. A method for converting a composite video signal into a digital signal according to a synchronized clock, comprising:
converting the composite video signal into the digital signal according to the synchronized clock, the synchronized clock being synchronized to a frequency and a phase of a color burst of chrominance signals of the composite video signal;
estimating the phase of the color burst carried on the composite video signal;
generating the synchronized clock according to the phase of the color bursts;
generating a pre-luminance signal and a pre-chrominance signal according to the digital signal;
demodulating the pre-chrominance signal to generate a first pre-chrominance signal and a second pre-chrominance signal;
generating an interpolation phase utilized to scale the pre-luminance signal, the first pre-chrominance signal and the second pre-chrominance signal according to a plurality of horizontal synchronization tips of the composite video signal; and
scaling the pre-luminance signal, the first pre-chrominance signal and the second pre-chrominance signal to generate the luminance signal, the first chrominance signal and the second chrominance signal according to the interpolation phase.

9. The method of claim 8, wherein a data rate of the digital signal is a positive integral multiple of four times the frequency of the color burst.

10. The method of claim 9, wherein a frequency of the synchronized clock is said positive integral multiple of four times the frequency of the color burst, the method further comprising:
down-sampling the digital signal to generate a down-sampled digital signal with a data rate of four times the frequency of the color burst, where the phase of the color burst is estimated according to the down-sampled digital signal.

11. The method of claim 10, further comprising:
filtering out a high frequency noise component of the digital signal to generate a filtered signal;
wherein the filtered signal is down-sampled to generate the down-sampled digital signal.

12. The method of claim 8, wherein the step of generating the synchronized clock comprises:
computing a difference between a pre-determined desired phase value and the phase of the color burst to generate a phase error signal;
generating a phase control signal and a frequency control signal according to the phase error signal; and
outputting the synchronized clock according to the phase control signal and the frequency control signal.

13. The method of claim 12, wherein the step of generating the phase control signal comprises:
multiplying the phase error signal by a pre-determined gain for outputting a phase adjusting signal; and
accumulating the phase adjusting signal to generate the phase control signal.

14. The method of claim 12, wherein the step of generating the frequency control signal comprises:
multiplying the phase error signal by a pre-determined gain for outputting a frequency adjusting signal;
accumulating the frequency adjusting signal to generate a frequency difference signal; and
adding an ideal desired frequency value to the frequency difference signal so as to generate the frequency control signal.

15. The method of claim 8, wherein the composite video signal complies with NTSC (National Television System Committee) standard or PAL (Phase Alternate Line) standard.

16. The method of claim 8, wherein the step of generating the interpolation phase comprises:
determining a starting boundary and a terminating boundary of each scan line according to two successive horizontal synchronization tips; and
generating the interpolation phase utilized to scale the pre-luminance signal, the first pre-chrominance signal and the second pre-chrominance signal according to the starting and terminating boundaries of said each scan line.

17. A video decoder for decoding a composite video signal to output a luminance signal and chrominance signals, comprising:
an analog-to-digital converter (ADC), for receiving the composite video signal and generating the digital signal according to a synchronized clock, the synchronized clock being synchronized to a frequency and a phase of a color burst of chrominance signals of the composite video signal;
a color burst phase estimator, coupled to the ADC, for estimating the phase of the color burst carried on the composite video signal;
a phase-locked loop (PLL), coupled to the color burst phase estimator, for generating the synchronized clock according to the phase of the color burst estimated by the color burst phase estimator;

a luminance/chrominance separator, coupled to the ADC, for generating a pre-luminance signal and a pre-chrominance signal according to the digital signal;

a U/V demodulator, coupled to the luminance/chrominance separator, for demodulating the pre-chrominance signal to generate a first pre-chrominance signal and a second pre-chrominance signal;

an interpolation phase generator, coupled to the ADC, for generating an interpolation phase utilized to scale the pre-luminance signal, the first pre-chrominance signal and the second pre-chrominance signal according to a plurality of horizontal synchronization tips of the composite video signal; and a digital interpolator, coupled to the luminance/chrominance separator, the U/V demodulator and the interpolation phase generator, for scaling the pre-luminance signal, the first pre-chrominance signal and the second pre-chrominance signal to generate the luminance signal, a first chrominance signal and a second chrominance signal according to the interpolation phase.

18. The video decoder of claim 17, wherein a data rate of the digital signal is a positive integral multiple of four times the frequency of the color burst.

19. The video decoder of claim 18, wherein a frequency of the synchronized clock is said positive integral multiple of four times the frequency of the color burst, the video decoder further comprising:

a down-sampler, coupled to the ADC, the luminance/chrominance separator and the color burst phase estimator, for down-sampling the digital signal to generate a down-sampled digital signal with a data rate four times as great as the frequency of the color burst, the down-sampled digital signal being utilized by the color burst phase estimator for estimating the phase of the color burst and by the luminance/chrominance separator for generating the pre-luminance signal and the pre-chrominance signal.

20. The video decoder of claim 19, further comprising:

a digital filter, coupled to the ADC and the down-sampler, for filtering out a high frequency noise component of the digital signal to generate a filtered signal;

wherein the filtered signal is fed into the down-sampler for generating the down-sampled digital signal.

21. The video decoder of claim 17, wherein the PLL comprises:

an adder, coupled to the color burst phase estimator, for computing a difference between a pre-determined desired phase value and the phase of the color burst to generate a phase error signal;

a phase and frequency controller, coupled to the adder, for generating a phase control signal and a frequency control signal according to the phase error signal; and a digitally controlled clock generator, coupled to the phase and frequency controller, for outputting the synchronized clock according to the phase control signal and the frequency control signal.

22. The video decoder of claim 21, wherein the phase and frequency controller comprises:

a multiplier, coupled to the phase error signal, for multiplying the phase error signal by a pre-determined gain and for outputting a phase adjusting signal; and an accumulator, coupled to the multiplier, for accumulating the phase adjusting signal to generate the phase control signal.

23. The video decoder of claim 21, wherein the phase and frequency controller comprises:

a multiplier, coupled to the phase error signal, for multiplying the phase error signal by a pre-determined gain and for outputting a frequency adjusting signal;

an accumulator, coupled to the multiplier, for accumulating the frequency adjusting signal to generate a frequency difference signal; and an adder, coupled to the accumulator, for adding an ideal desired frequency value to the frequency difference signal and for generating the frequency control signal.

24. The video decoder of claim 17, wherein the composite video signal complies with NTSC (National Television System Committee) standard or PAL (Phase Alternate Line) standard.

25. The video decoder of claim 17, wherein the interpolation phase generator comprises:

an HSYNC slicer, coupled to the ADC, for separating said synchronization tips to determine a starting boundary and a terminating boundary of each scan line according to two successive horizontal synchronization tips bursts; and a digital line-locked PLL, coupled to the HSYNC slicer, for generating the interpolation phase utilized to scale the pre-luminance signal, the first pre-chrominance signal and the second pre-chrominance signal according to the starting and terminating boundaries of said each scan line.

26. A method for converting a composite video signal into a digital signal according to a synchronized clock, comprising:

converting the composite video signal into the digital signal according to the synchronized clock, the synchronized clock being synchronized to a frequency and a phase of a color burst of chrominance signals of the composite video signal;

estimating the phase of the color burst carried on the composite video signal; and generating the synchronized clock according to the phase of the color burst;

wherein the step of generating the synchronized clock comprises:

computing a difference between a pre-determined desired phase value and the phase of the color burst to generate a phase error signal;

generating a phase control signal and a frequency control signal according to the phase error signal; and outputting the synchronized clock according to the phase control signal and the frequency control signal.

27. The method of claim 26, wherein the step of generating the phase control signal comprises:

multiplying the phase error signal by a pre-determined gain for outputting a phase adjusting signal; and accumulating the phase adjusting signal to generate the phase control signal.

28. The method of claim 26, wherein the step of generating the frequency control signal comprises:

multiplying the phase error signal by a pre-determined gain for outputting a frequency adjusting signal;

accumulating the frequency adjusting signal to generate a frequency difference signal; and adding an ideal desired frequency value to the frequency difference signal so as to generate the frequency control signal.

* * * * *